(12) United States Patent
Panzer et al.

(10) Patent No.: US 6,729,775 B2
(45) Date of Patent: May 4, 2004

(54) ELECTRO-OPTICAL MODULE WITH A HOUSING

(75) Inventors: Klaus Panzer, Regensburg (DE); Hans Hurt, Regensburg (DE)

(73) Assignee: Infineon Technologies AG, Munich (DE)

( * ) Notice: Subject to any disclaimer, the term of this patent is extended or adjusted under 35 U.S.C. 154(b) by 39 days.

(21) Appl. No.: 10/103,509

(22) Filed: Mar. 22, 2002

(65) Prior Publication Data

US 2002/0102076 A1 Aug. 1, 2002

Related U.S. Application Data

(63) Continuation of application No. PCT/DE00/03369, filed on Sep. 21, 2000.

(30) Foreign Application Priority Data

Sep. 22, 1999 (DE) .......................... 199 46 101

(51) Int. Cl.[7] .................................................. G02B 6/42
(52) U.S. Cl. ........................................................ 385/92
(58) Field of Search .......................... 385/88, 89, 92–94

(56) References Cited

U.S. PATENT DOCUMENTS

| 4,926,433 | A | | 5/1990 | Imamura et al. |
|---|---|---|---|---|
| 5,239,605 | A | | 8/1993 | Shimada |
| 5,337,396 | A | * | 8/1994 | Chen et al. .................... 385/92 |
| 5,475,783 | A | | 12/1995 | Kurashima |
| 5,539,767 | A | | 7/1996 | Nakanishi et al. |
| 6,071,016 | A | * | 6/2000 | Ichino et al. .................. 385/92 |
| 6,213,651 | B1 | * | 4/2001 | Jiang et al. .................... 385/92 |

FOREIGN PATENT DOCUMENTS

| DE | 196 22 459 C1 | 11/1997 |
|---|---|---|
| EP | 0 646 816 A2 | 4/1995 |
| EP | 0 921 426 A1 | 6/1999 |
| EP | 1 146 371 A2 | 10/2001 |
| JP | 61 174 794 | 8/1986 |
| WO | WO99/16133 | 4/1999 |

* cited by examiner

Primary Examiner—Rodney Bovernick
Assistant Examiner—Michael J. Stahl
(74) Attorney, Agent, or Firm—Laurence A. Greenberg; Werner H. Stemer; Ralph E. Locher

(57) ABSTRACT

The electro-optical module has a housing in which a supporting plate provided with at least one optical element, electric circuit elements, and electric connection elements is accommodated. The object is to provide such a module with a smallest possible additional spatial requirement and good electrical properties with additional electric circuit elements. To this end, the circuit elements are arranged outside of the housing on a circuit board which forms an integral part of the wall of the housing. The circuit board is directly electrically connected to the supporting plate.

4 Claims, 1 Drawing Sheet

ELECTRO-OPTICAL MODULE WITH A HOUSING

CROSS-REFERENCE TO RELATED APPLICATION

This application is a continuation of copending International Application No. PCT/DE00/03369, filed Sept. 21, 2000, which designated the United States.

BACKGROUND OF THE INVENTION

Field of the Invention

The present invention relates to an electro-optical module with a housing in which a carrier plate or circuit board is accommodated. The plate carries at least one optical element, electrical circuit elements, and electrical terminal elements.

An electro-optical module of the generic type is described in U.S. Pat. No. 5,475,783 and published European patent application EP 0 646 816 A2. In the prior art module, a circuit board with an optical element is so disposed in a housing transverse to the optical axis of the module, that the optical element lies on the optical axis. The carrier plate of the prior art module is fashioned in accordance with the type of printed circuit board and comprises electronic components which are connected to one another by printed interconnects. In addition, the front side of the carrier plate of the prior art module is provided with electrical terminal elements. With the aid of these electrical terminal elements, the known electro-optical module can be electrically connected to interconnects on a printed circuit board, for instance, by placing the module onto the printed circuit board in customary fashion. The number of electrical circuit elements that can be accommodated on the carrier plate is limited given a prescribed structural shape of the housing of the known electro-optical module.

If additional electrical circuit elements are to be allocated to the known electro-optical module, the obvious solution is to accommodate these additional electrical circuit elements on an additional board, and to install this additional printed board behind the electro-optical module (with reference to the optical axis) on a printed circuit board; the electrical connection to the electro-optical module is produced via the latter printed circuit board. Not only does this require additional expense, but it also demands additional space on the board; moreover, the routing from the additional printed board to the electro-optical module and vice versa by way of the printed circuit board can adversely affect the transferred signals—that is to say, the circuit with the circuit elements. U.S. Pat. No. 4,926,433 describes a laser unit for a laser printer wherein additional electrical circuit elements besides a laser diode are arranged on a carrier plate. The circuit elements are disposed on the side of the carrier plate which is averted from the laser unit. However, the carrier plate is not situated in a housing.

SUMMARY OF THE INVENTION

It is accordingly an object of the invention to provide an electro-optical module with a housing, which overcomes the above-mentioned disadvantages of the heretofore-known devices and methods of this general type and which allows equipping the electro-optical module with additional electrical circuit elements at relatively small expense while a compact design is maintained.

With the foregoing and other objects in view there is provided, in accordance with the invention, an electro-optical module, comprising:

a housing having a wall;
a carrier plate with at least one optical element, electrical circuit elements, and electrical terminal elements accommodated in the housing;
a circuit board fastened externally on the wall of the housing and directly electrically connected to the carrier plate; and
additional electrical circuit elements disposed on the circuit board outside the housing.

In accordance with an added feature of the invention:
the carrier plate and the circuit board are disposed parallel to one another and oriented transverse to an optical axis of the electro-optical module; and
the circuit board is formed with external electrical terminal portions of the electro-optical module on one front side thereof.

In accordance with a concomitant feature of the invention, the carrier plate has electrical terminal elements, and the circuit board is electrically connected to the electrical terminal elements at a region of a front side opposite the front side having the external electrical terminal portions.

With the above and other objects in view there is also provided, in accordance with the invention, an electro-optical module with a housing, comprising:
a carrier plate with at least one optical element, electrical circuit elements, and electrical terminal elements accommodated in the housing;
a circuit board at least partly forming a wall of the housing and additional electrical circuit elements disposed on the circuit board, wherein:
the additional electrical circuit elements are arranged on the circuit board outside the housing; and
the circuit board is directly electrically connected to the carrier plate.

In other words, the objects are achieved by disposing additional electrical circuit elements in an electro-optical module on a circuit board which either is fastened externally on the wall of the housing of the electro-optical module or is part of the wall of the housing of the electro-optical module. The additional electrical circuit elements are arranged outside the housing on the circuit board, and the circuit board is directly electrically connected to the carrier plate.

A substantial advantage of the inventive solution is that the additional electrical circuit elements are situated at the smallest imaginable remove from the housing of the electro-optical module, being arranged outside the housing on a circuit board which is fastened on the wall of the housing or which forms part of the wall; therefore, the routing between the carrier plate and the circuit board is quite short, and disturbances by the electrical connections are substantially prevented. Another advantage is that the space requirement for the circuit board and the additional circuit elements is small owing to the direct connection of the circuit board to the carrier plate.

In the inventive variant wherein the circuit board is fastened outside on the wall of the housing, the circuit board can be equipped with the additional electrical circuit elements in customary fashion and then fastened to the wall of the housing.

The inventive variant in which the circuit board is part of the wall of the housing of the electro-optical module is particularly advantageous in view of the space requirement. In this variant of the invention, a separate circuit board for accepting the additional electrical circuit elements is completely forgone in that a part of the wall of the housing is used as a circuit board.

In the inventive electro-optical module, the carrier plate and circuit board can be configured in or at the electro-optical module various ways and in various spatial configurations.

But it is considered particularly advantageous when the carrier plate and circuit board are oriented transverse to the optical axis of the electro-optical module in parallel planes, and when the circuit board comprises external electrical terminal portions of the electro-optical modules on one front side. This embodiment is characterized by a particularly compact design. The front side is the bottom edge of the module at which the fastening on the printed circuit board is carried out.

This compact design is furthered by the electrical connecting of the circuit board to the electrical terminal elements of the carrier plate in the region of the front side opposite the front side with the outer electrical terminal portions.

Other features which are considered as characteristic for the invention are set forth in the appended claims.

Although the invention is illustrated and described herein as embodied in an electro-optical module with a housing, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
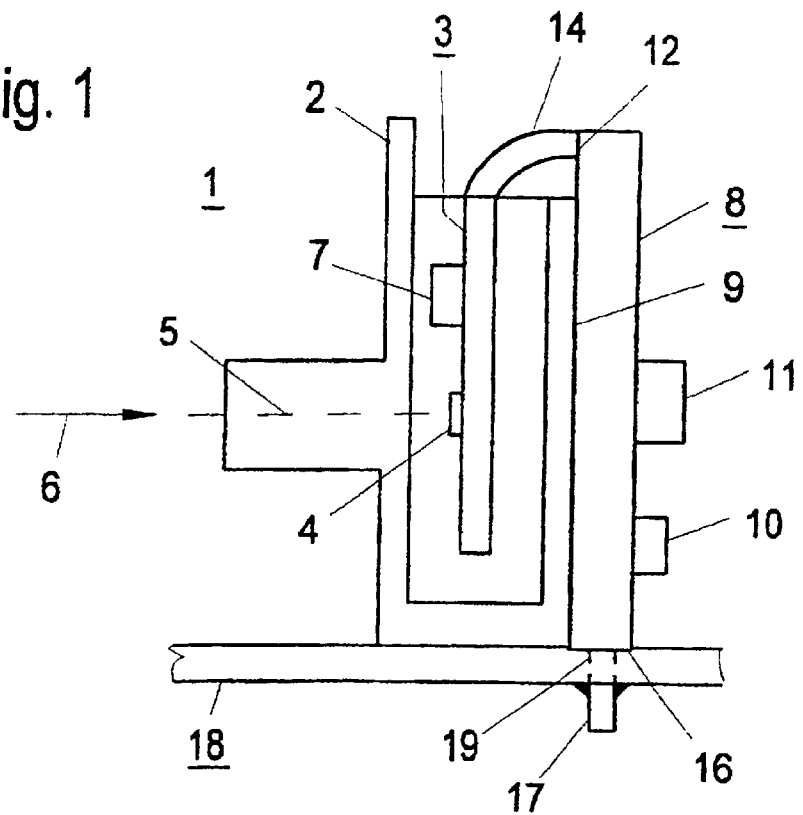
FIG. 1 is a diagrammatic side view of an exemplary embodiment of an electro-optical module according to the invention.

Referring now to the figures of the drawing in detail and first, particularly, to FIG. 1 thereof, there is shown an electro-optical module 1 with a housing 2, also referred to as a package, in which a carrier plate 3 or circuit board is accommodated. The carrier plate 3 is provided with an optical element 4, which is arranged in the course of an optical axis 5 of the electro-optical module 1. The optical element 4 can be a light receiver, for instance, to which light is guided in the direction of arrow 6. In the represented exemplary embodiment, the carrier plate 3 is also provided with electrical circuit elements, only one of which, namely a pre-amplifier 7, is represented in FIG. 1 for the sake of better surveyability.

A printed circuit board 8 is fastened to the housing 2 of the represented electro-optical module 1 in that it is attached to the wall 9 of the housing 2 by gluing. Before the circuit board 8 is fastened, it is expediently equipped with additional electrical components, of which only a resistor 10 and a postamplifier 11 are represented in the figures.

The circuit board 8 is provided with interconnects in the customary fashion (though these are not represented in the figure) and electrically connected to electrical terminal elements 14 of the carrier plate 3 at the point 12. At one front side 16 at the bottom of FIG. 1, the circuit board 8 is provided with outer electrical terminal portions 17, of which only one circuit portion is represented.

FIG. 1 further represents how the electro-optical module 1 with the attached circuit board 8 is placed on a printed circuit board 18, its electrical terminal portions 17 being guided through boreholes 19 in the printed circuit board 18. The electrical terminal portions 17 are connected to interconnects on the printed circuit board 18 (which are not represented) by soldering.

Figure 2:
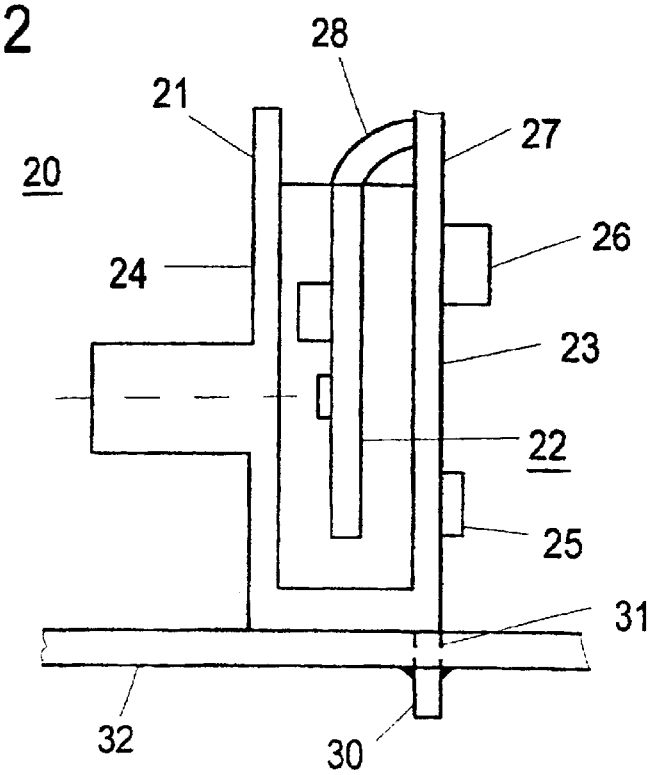
FIG. 2 represents another exemplary embodiment of the novel electro-optical module, likewise diagrammatically.

The electro-optical module 20 represented in FIG. 2 likewise comprises a housing 21 in which a carrier plate 22 is accommodated, which is similar to the carrier plate 3 in terms of its design and equipment. A wall 23 of the wall system 24 of the housing 21 forms the circuit board here; a resistor 25 and a post-amplifier 26 are attached to the wall 23 on the outside. The wall 23 is constructed in the fashion of what is known as an MID (Molded Interconnect Device) arrangement and therefore contains lines (which are not represented) in its interior as well as interconnects (which are not represented) on its exterior surface 27. The interconnects and lines of the wall 23 connect the electrical terminal elements 28 of the carrier plate 22 on one side and terminal portions 30 on the other side, which are led in turn through boreholes 31 in a printed circuit board 32 and soldered there. The pass-through technique or SMD (surface mounted device) technique can be applied for the soldering.

We claim:

1. An electra-optical module, comprising:

an optical axis;

a housing having a wall;

a carrier plate with at least one optical element, electrical circuit elements, and electrical terminal elements accommodated in said housing;

a circuit board fastened externally on said wall of said housing, directly electrically connected to said carrier plate, and having a front side;

additional electrical circuit elements disposed on said circuit board outside said housing;

said carrier plate and said circuit board being disposed parallel to one another and oriented transverse to said optical axis; and external electrical terminal portions disposed on said front side of said circuit board.

2. The electro-optical module according to claim 1, wherein said carrier plate has electrical terminal elements, and said circuit board is electrically connected to said electrical terminal elements at a region of a front side opposite said front side having said external electrical terminal portions.

3. An electro-optical module, comprising:

a housing;

a carrier plate with at least one optical element, electrical circuit elements, and electrical terminal elements accommodated in said housing;

a circuit board at least partly forming a wall of said housing and additional electrical circuit elements disposed on said circuit board, said additional electrical circuit elements being arranged on said circuit board outside said housing, said circuit board being directly electrically connected to said carrier plate;

said carrier plate and said circuit board being disposed parallel to one another and oriented transverse to an optical axis of the electro-optical module; and said circuit board being formed with external electrical terminal portions of the electro-optical module on one front side thereof.

4. The electro-optical module according to claim 3, wherein said carrier plate has electrical terminal elements, and said circuit board is electrically connected to said electrical terminal elements at a region of a front side opposite said front side having said external electrical terminal portions.

* * * * *